(12) United States Patent
Kerrigan (10) Patent No.: US 7,542,306 B2
(45) Date of Patent: Jun. 2, 2009

(54) APPARATUS FOR DIRECTING POWER TO A HOT SWAPPED CIRCUIT BOARD

(75) Inventor: Brian Michael Kerrigan, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/679,703

(22) Filed: Feb. 27, 2007

(65) Prior Publication Data
US 2008/0209097 A1 Aug. 28, 2008

(51) Int. Cl.
H05K 7/18 (2006.01)
H05K 7/14 (2006.01)

(52) U.S. Cl. .................. 361/801; 361/759; 361/796; 361/797

(58) Field of Classification Search .......... 361/796, 361/752, 759, 756, 797, 801; 248/694
See application file for complete search history.

(56) References Cited

U.S. PATENT DOCUMENTS

| | | | |
|---|---|---|---|
| 5,530,302 A | | 6/1996 | Hamre et al. |
| 5,751,559 A | | 5/1998 | Jensen et al. |
| 5,788,509 A | * | 8/1998 | Byers et al. ............. 439/61 |
| 5,996,962 A | * | 12/1999 | Chang et al. ............ 248/694 |
| 6,182,173 B1 | | 1/2001 | Grosser et al. |
| 6,215,673 B1 | | 4/2001 | Gordon et al. |
| 6,232,676 B1 | | 5/2001 | Kozyra et al. |
| 6,247,079 B1 | | 6/2001 | Papa et al. |
| 6,288,911 B1 | | 9/2001 | Aoki et al. |
| 6,355,991 B1 | | 3/2002 | Goff et al. |
| 6,411,517 B1 | * | 6/2002 | Babin ................... 361/759 |
| 6,636,428 B2 | * | 10/2003 | Follmer et al. ........... 361/797 |
| 6,667,888 B1 | * | 12/2003 | Chang et al. ............ 361/737 |
| 6,816,390 B1 | * | 11/2004 | Barringer et al. ......... 361/801 |
| 6,850,417 B2 | * | 2/2005 | Cooper et al. ........... 361/752 |

(Continued)

OTHER PUBLICATIONS

PCT International Search Report and PCT Written Opinion of the International Searching Authority for PCT/EP2008/050923; Apr. 14, 2008, 13 pages.

(Continued)

*Primary Examiner*—Jeremy C Norris
*Assistant Examiner*—Andargie M Aychillhum
(74) *Attorney, Agent, or Firm*—Cynthia S. Byrd; Jeffrey L. Streets (57) ABSTRACT

An apparatus comprising a chassis and a cassette. The chassis includes a first electronic circuit board with a first connector, chassis flex circuitry with a disengageable contacts, a controller in communication with the chassis flex circuitry, and a power supply in communication with the controller and the first electronic circuit board. The cassette is selectively securable to the chassis, the cassette including a second electronic circuit board with a second connector, and a cassette handle with cassette flex circuitry that includes a switch and disengageable contacts, wherein securing the cassette to the chassis positions the disengageable contacts of the cassette flex circuitry in engagement with the disengageable contacts of the chassis flex circuitry to form a circuit and positions the first connector in electronic communication with the second connector, and wherein the circuit allows the controller to detect the condition of the switch. A switch trigger is disposed on the cassette handle to actuate the switch, wherein the switch trigger selectively locks or unlocks the cassette to the chassis.

9 Claims, 7 Drawing Sheets

U.S. PATENT DOCUMENTS

| | | |
|---|---|---|
| 7,112,084 B1* | 9/2006 | Mease et al. ................. 439/342 |
| 2003/0063454 A1 | 4/2003 | Wilson et al. |
| 2003/0072139 A1* | 4/2003 | Yamaguchi et al. ......... 361/759 |
| 2004/0008497 A1* | 1/2004 | Barringer et al. ............ 361/759 |
| 2005/0265010 A1* | 12/2005 | Bundza et al. ............... 361/796 |
| 2006/0085962 A1* | 4/2006 | Kerrigan et al. ............ 29/426.5 |

OTHER PUBLICATIONS

PCI Express ExpressModule Electromechanical Specification Revision 1.0; Feb. 14, 2005; copyright 2005; 16 pages.

PCI Express Base Specification Revision 1.1; Mar. 28, 2005; Copyright 2005; 14 pages.

* cited by examiner

APPARATUS FOR DIRECTING POWER TO A HOT SWAPPED CIRCUIT BOARD

BACKGROUND OF THE INVENTION

1. Field of the Invention

The present invention relates to computer hardware components. More specifically, the present invention provides an apparatus for directing power to a hot-swappable computer component when inserted, and safely powering down the component prior to removal.

2. Description of the Related Art

Hot swappable components have become commonplace in computer systems. Server systems often use hot swappable memory, hard drives, and various pieces of hardware commonly referred to as Peripheral Component Interconnect (PCI) cards. Hot swapping may involve the removal of a piece of hardware, or the insertion of a piece of hardware, or both while the computer is on and functioning. While the following discussion refers to PCI cards, the problems presented are equally applicable to any other hot swappable electronic circuit board.

Computer systems that support hot swapping need some ability to detect that a component has been removed or inserted and to determine what resources are available for use. Notifying the system that a component has been inserted or removed allows for efficient allocation of resources and the use of computing power.

In addition, all connections need to be designed such that neither the component nor the user can be damaged or injured by removing or installing it. Most, if not all, computer components require power to be operational. The electronic connections between components must be designed to ensure that connecting the components will not result in a power surge to either component, which may result in damage to sensitive electronics.

The components of the computer system must be designed to accommodate removal or installation of other components. When a component is removed, the computer system must reallocate tasks to other components. When a component is inserted, the system must be able to allocate tasks to that component in order to make the most efficient use of the system resources.

One method of inserting a PCI card is to utilize a cassette system in which the PCI card with a connector is secured. The cassette may then be inserted into a chassis wherein a connection is made between the PCI card within the cassette, and other pieces of hardware with receiving connectors.

Many PCI cards receive power from the connector in which they are inserted. In order to avoid power surges and damage to the PCI card or the user, it is preferable that no power is being provided to a receiving connector during insertion or removal of a PCI card. Future implementations of operating system software may require that no power is provided to the receiving connector during insertion or removal of a PCI card.

Therefore, there is a need for an apparatus and method to ensure that no power is provided during removal of a PCI card, as well as preventing power to the PCI card during insertion. When a cassette system is employed to insert and remove electronics, it is desirable to incorporate this feature into the cassette.

SUMMARY OF THE INVENTION

The present invention provides a chassis to receive a cassette. The cassette is used to insert or remove a second electronic circuit board with a second connector, into the chassis housing a first electronic circuit board with a first connector that receives the second connector. The second electronic circuit board with the second connector is secured by the cassette. The cassette further comprises an activation switch. When the cassette is properly received by the chassis and the switch is activated, the activation of the switch indicates to a controller that the second connector of the second electronic circuit board has been received in the first connector of the first electronic circuit board. The controller instructs a power source to provide power to the second connector of the second circuit board through the first connector. The invention preferably locates the switch on a cassette handle, where the switch is activated or deactivated by a user manually toggling a switch trigger on the cassette handle.

When the switch associated with a powered second electronic circuit board is deactivated, the controller instructs the second electronic circuit board to complete any operations underway and enter a quiescent state where no data transmission is occurring. The controller also prevents further operations from being assigned to the second electronic circuit board, such as by instructing the first electronic circuit board not to assign further operations. Upon completion by the second electronic circuit board of any ongoing operations (i.e., reaching a quiescent state), the controller instructs the power source to halt the power supplied to the second connector of the second circuit board through the first connector. In one embodiment, an indicator light, such as an LED on the cassette, informs the user that the second electronic circuit board is quiescent and that the second connector of the second electronic circuit board may be safely disengaged from the first connector without any loss of date over the PCI bus by lifting the cassette handle.

DETAILED DESCRIPTION

The present invention provides a chassis that receives a cassette, supplies power to the cassette, and communicates with electronic components on the cassette, such as an electronic circuit board. The chassis comprises a first electronic circuit board with a first connector to receive a second electronic circuit board with a second connector. The cassette and the chassis selectively cooperate in a predetermined manner to align the second connector with the first connector. The first electronic circuit board has a first connector that receives a second electronic circuit board and supplies power to the second electronic circuit board. A typical example of a first electronic circuit board is a motherboard.

The chassis further comprises chassis flex circuitry including a pair of contacts arranged to contact cassette flex circuitry when the cassette is received by the chassis. The cassette flex circuitry and the chassis flex circuitry complete a circuit when there is contact therebetween. The chassis flex circuitry includes an electrically conducting material, such as a conducting metal. Portions of the conducting metal that are exposed to air, such as a set of contacts, are preferably made of a non-corroding metal, such as gold.

The chassis flex circuitry is coupled to a controller and the controller is in communication with a power supply. The controller regulates the provision of power to the first connector of the chassis, and therefore to the electronic components of the cassette, based upon the state of a switch in the cassette flex circuitry.

The cassette includes a second electronic circuit board having a second connector to be received by the first connector. The second electronic circuit board may be any hardware that is commonly inserted and/or removed "on-the-fly", while the computer system is in operation (hot swapped). Daughter cards, PCI cards, and USB drives are some examples of hardware that may be hot swapped. Many, if not all, of these devices receive power from the connector into which they are plugged.

The cassette further comprises a cassette handle with the cassette flex circuitry. The cassette handle is preferably comprised of a non-conducting material, to insulate the user from any potential electrical shock. The cassette flex circuitry is electrically conductive and includes a switch between two terminal contacts configured to make contact with an opposing pair of contacts on the chassis. While the cassette flex circuitry may be made of any conductive metal, those portions exposed to air are preferably comprised of a non-corroding metal, such as gold. The switch selectively opens or closes the cassette flex circuitry. In one embodiment, the switch closes to complete the cassette flex circuitry between the two contacts of the cassette flex circuitry and opens to break the cassette flex circuitry so that no current may be conducted through the cassette flex circuitry.

The cassette handle may further comprise a spring and a switch trigger to actuate the switch, and maintain the switch trigger in a desired rest position. Preferably, the switch is in a closed condition unless a user has actuated the switch trigger. The switch trigger is preferably made of a non-conducting material to insulate the user from any potential electrical shock. The switch trigger preferably extends along the underneath side of the handle so that the trigger is moved to actuate the switch by a user's natural grasp of the handle.

Optionally, the chassis may further comprise an access cover. The access cover, when closed, prevents the cassette from being removed from the chassis. In one embodiment, the access cover may activate a switch that is physically adjacent the access cover and electronically in series within the chassis flex circuitry. Alternatively, the access cover may activate a switch that communicates directly with the controller. Accordingly, the controller may implement logic that ignores changes in the flex circuit when the access door is indicated as being closed, since no cassette may be either installed or removed if the access door is closed. This logic or circuit may prevent faulty wiring or false signals related to the flex circuit from inadvertently causing a cassette to shut down.

The apparatus operates to safely power down a second electronic circuit board during insertion or removal of the cassette including the board. The flex circuit, which includes the chassis flex circuitry and the cassette flex circuitry, is closed only when the cassette is properly secured to the chassis and the handle is not being grasped. Therefore, a closed flex circuit indicates that power should be provided to the one or more circuit boards associated with the cassette. It should be recognized that the chassis may be configured with multiple bays to receive multiple cassettes, in which case the chassis will preferably include separate chassis flex circuitry for each bay in order to independently control power from each bay to each cassette.

An open flex circuit indicates either that a cassette has not been fully received or, if the cassette has in fact been fully received and operational, that the user intends to remove the cassette. Therefore, an open flex circuit indicated that any data processing and transmission should be completed and halted. To do complete processing and transmissions, the second electronic circuit board (i.e., a PCI card) requests access to the data bus. Once the PCI card is granted permission by the bus, the PCI card completes its data transmissions so that no data is lost when the card loses power and it removed. When the controller identifies that the PCI card is quiescent, the card may be safely removed. Preferably, the system includes a fail safe warning feature by which a user is informed of the quiescent condition, such as through the use of a visual indicator light, indicating that the user may safely remove the card without data loss.

The following figures illustrate the apparatus in one embodiment of the invention as potentially implemented in the IBM Sundance D11 product.

Figure 1:
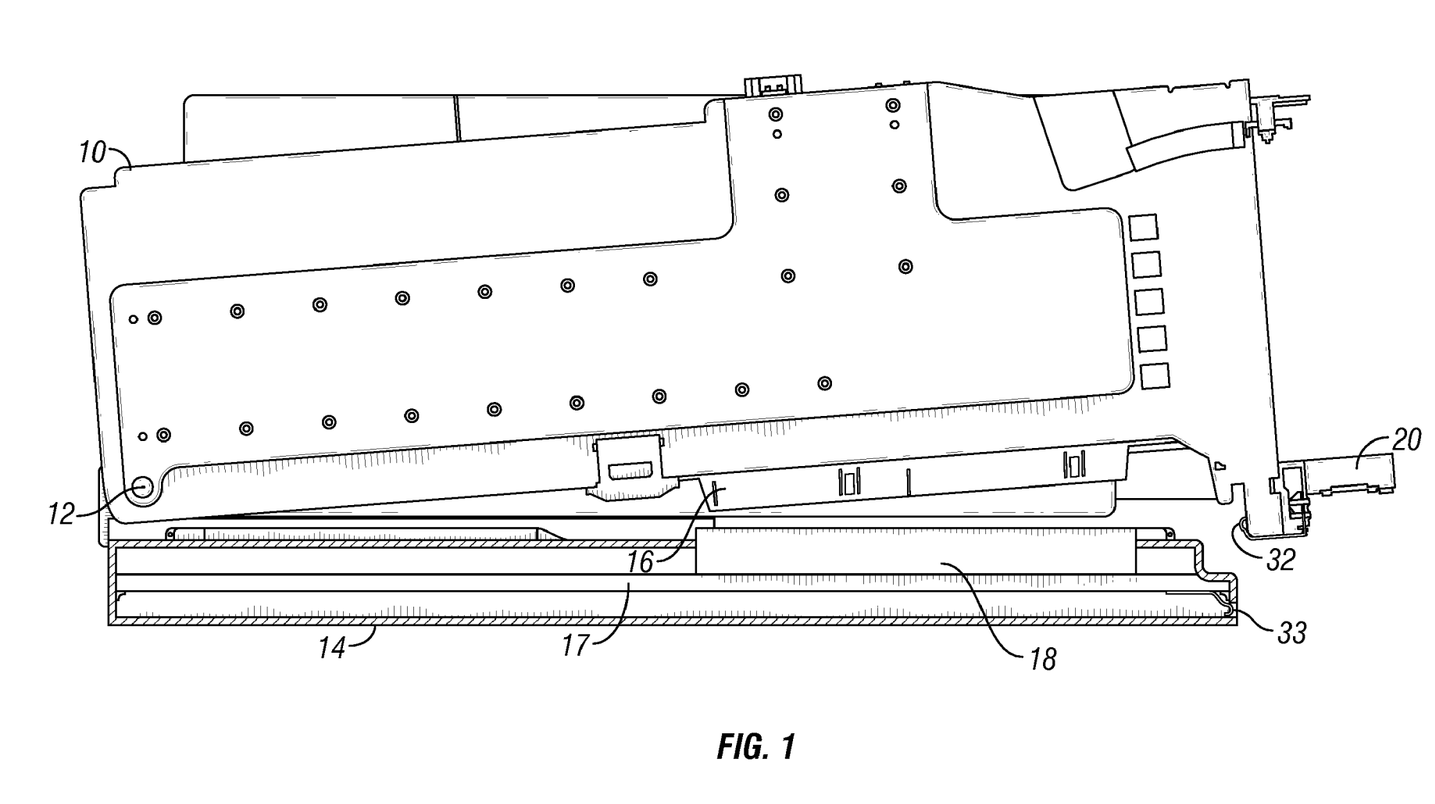
FIG. 1 is a side view of a cassette pivotally secured to a chassis in the up position.

FIG. 1 is a side view of a chassis 14 with a cassette 10 received and pivotally secured at a first end 12. The chassis 14 houses a first electronic circuit board 17 with a first connector 18 to receive a second connector 16. A second electronic circuit board (not shown) is secured by the cassette 10 and includes a second connector 16 having contacts for receiving power and handling communications. The cassette and chassis are selectively secured in a predetermined configuration to align the second connector 16 with the first connector 18. The cassette comprises a handle 20 to lift or lower the cassette 10. In FIG. 1, the cassette 10 is in an open or disconnected position, with the second connector 16 not yet received in the first connector 18.

Figure 2:
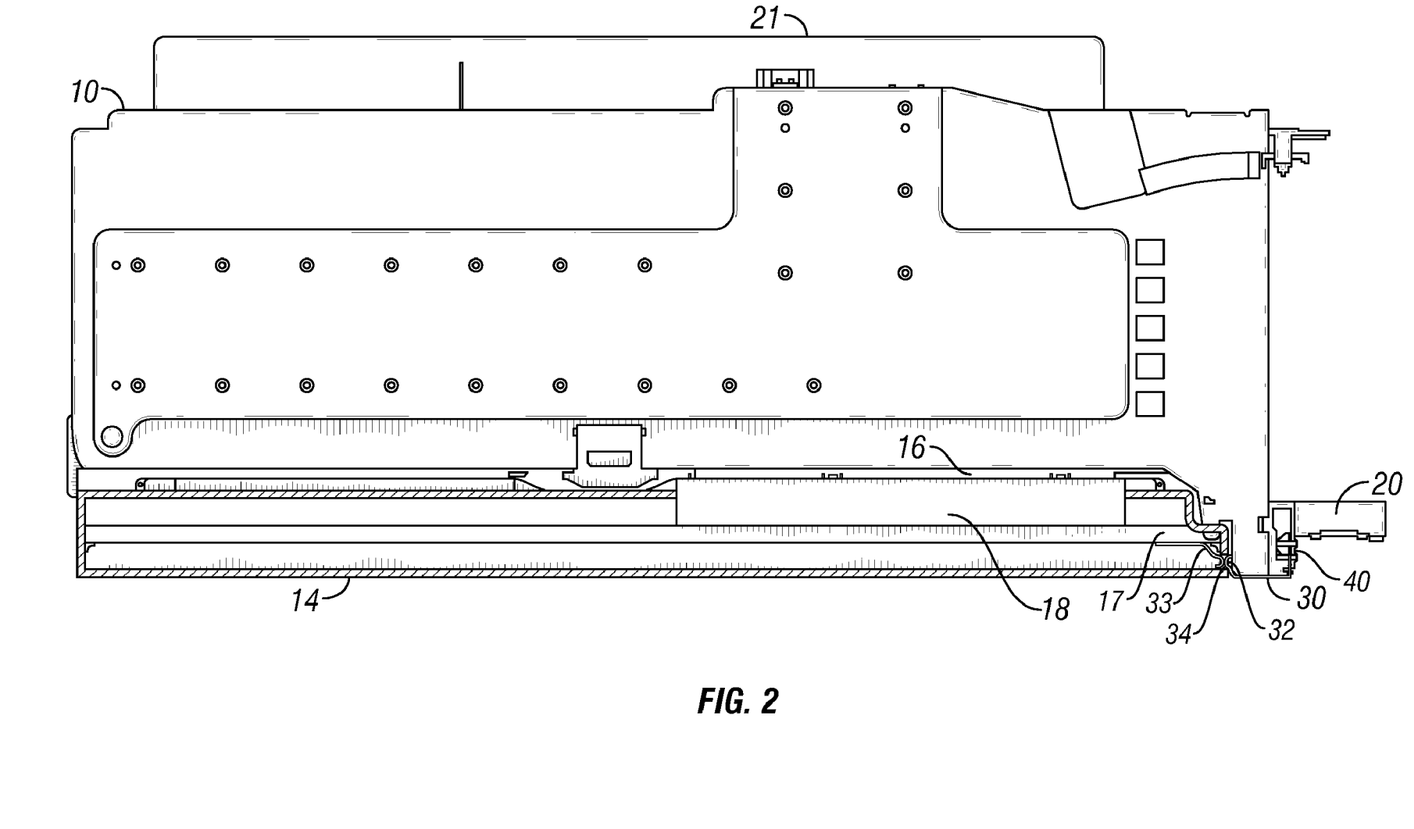
FIG. 2 is a side view of a cassette pivotally secured to a chassis in the down position.

FIG. 2 is a side view of the chassis and cassette of FIG. 1 with the cassette 10 in a closed or connected position. When the cassette 10 is properly closed as shown, the second connector 16 is received by the first connector 18 for electronic communication there between. The chassis 14 is also shown including a sliding access cover 21. When the sliding access cover 21 is closed, the cassette 10 may not be raised into the open position by lifting the handle 20. The sliding access cover 21 may have a pair of contacts (not shown) to selectively complete a circuit (not shown) within the chassis, optionally within the chassis flex circuitry, to indicate the position of the access door.

Figure 3:
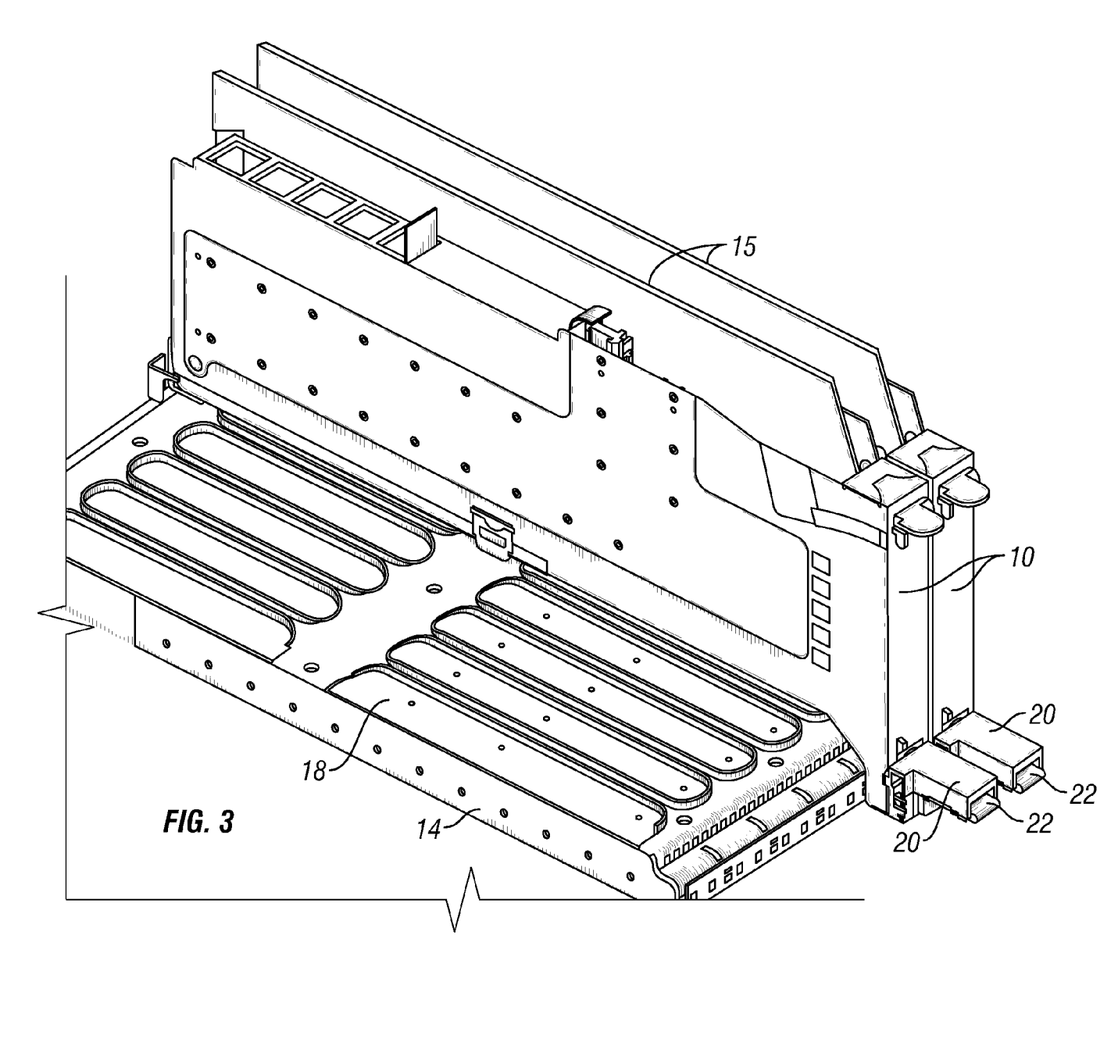
FIG. 3 is a perspective view of a plurality of cassettes received within a chassis.

FIG. 3 is a perspective view of two cassettes 10 on a chassis 14 having six bays. Each cassette 10 has a second electronic circuit board 15 secured to the cassette. As shown, the second connector (see FIG. 1) on each second electronic circuit board 15 has already been received into a first connector 18 (see FIG. 1) on a first electronic circuit board of the chassis 14. Each cassette 10 comprises a handle 20 having a switch trigger 22 that must be depressed prior to raising the cassette 10 into the open position (shown in FIG. 1). The switch trigger 22 may also control a lock (now shown) that selectively secures the cassette 10 to the chassis 14.

Figure 4:
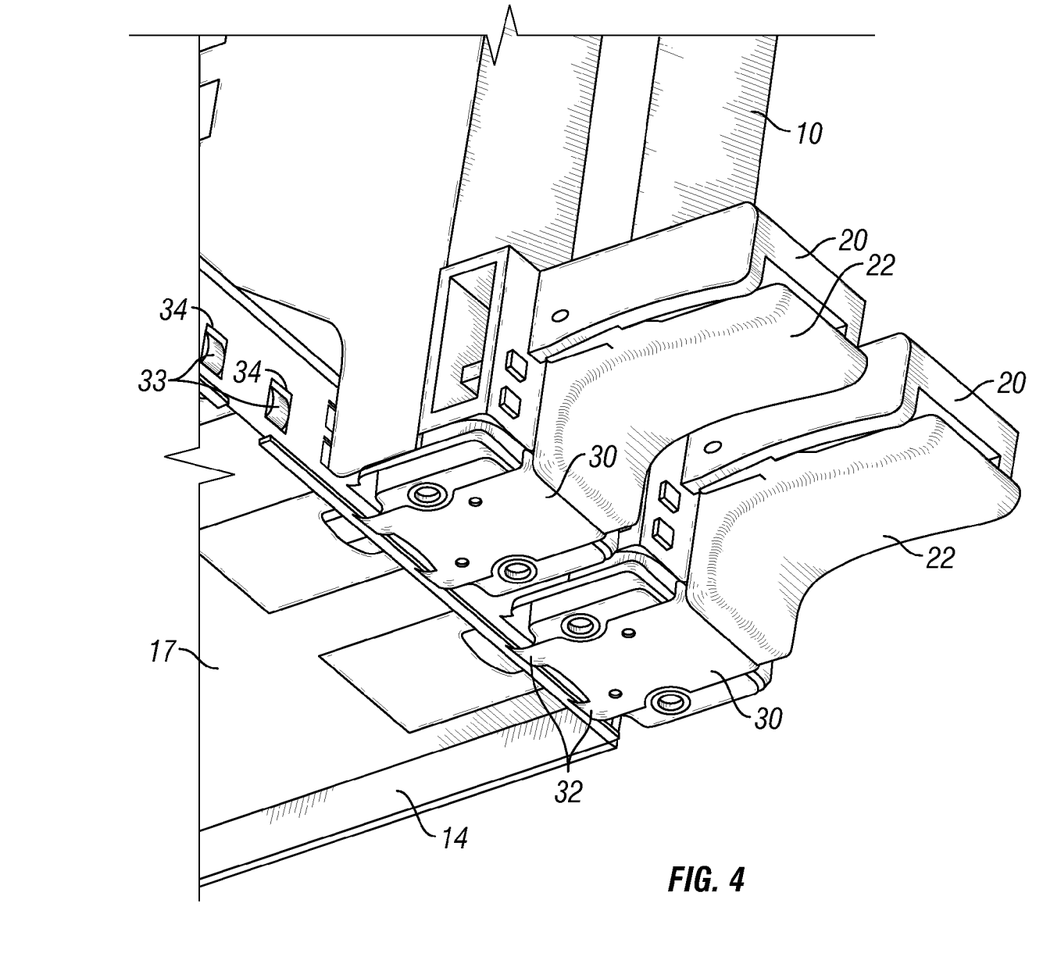
FIG. 4 is a detailed view of a plurality of cassettes with handles received in a chassis.

FIG. 4 is a lower perspective view of the two cassettes 10 received by the chassis 14, in accordance with FIG. 3. Each handle 20 comprises a switch trigger 22 that must be depressed (upwardly in FIG. 4) during installation and removal of the cassette 10 relative to the chassis. Each handle 20 further comprises cassette flex circuitry 30. The cassette flex circuitry 30 has contacts 32 forming contacts that align with and engage opposing contacts 34 on the chassis.

Depressing the switch trigger 22 activates a switch (not shown) that opens the circuit comprising the cassette flex circuitry 30.

Figure 5:
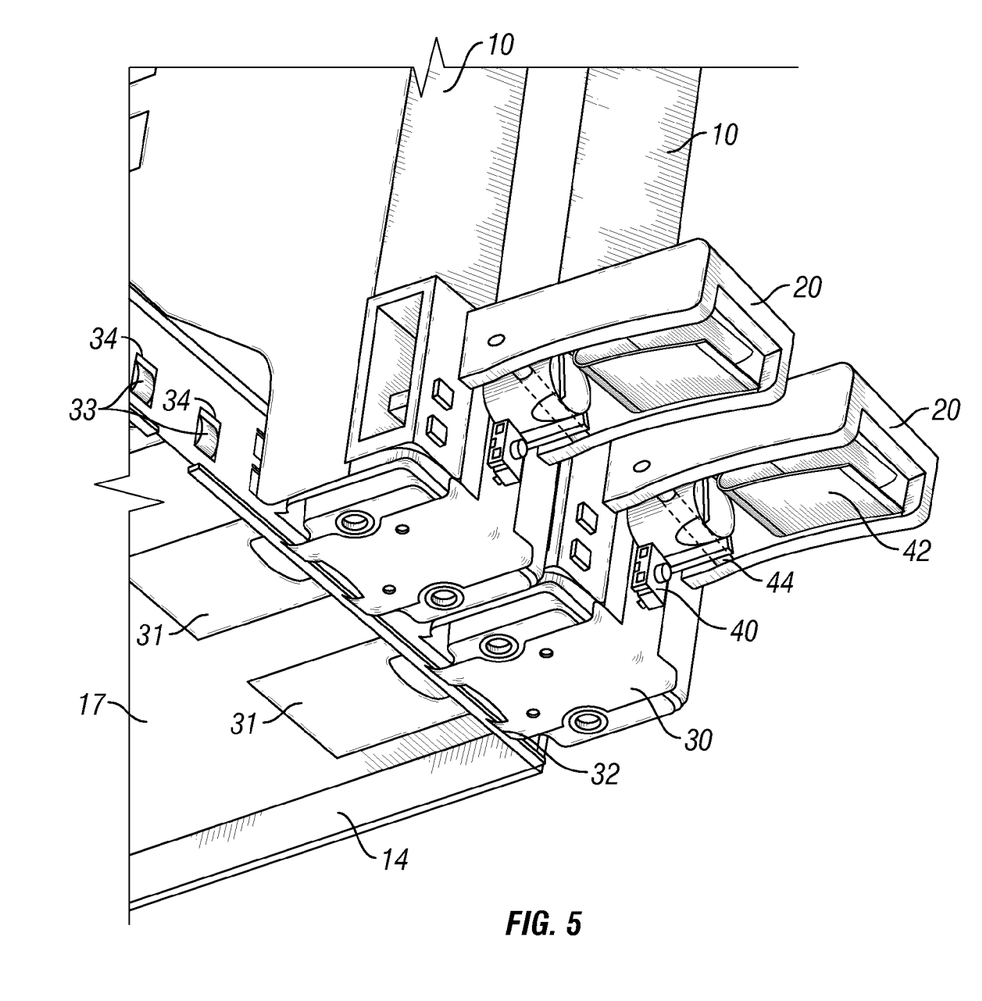
FIG. 5 is a detailed view of a plurality of cassettes with handles received in a chassis. The switch trigger is not shown.

FIG. 5 is a lower perspective view in accordance with FIG. 4, but having the switch trigger (shown in FIG. 4 as 22) removed to reveal further components. The handle 20 secures the cassette flex circuitry 30 that further comprises a switch 40. The switch 40 selectively completes a circuit comprising the cassette flex circuitry 30 based upon whether the switch is actuated. In this embodiment, the switch 40 completes a circuit comprising the cassette flex circuitry 30 when depressed. A spring 42 in the handle 20 biases the switch trigger toward the switch 40 to normally maintain the switch 40 in the depressed position. Accordingly, the user upwardly depresses the switch trigger to release the switch 40 and break the circuit. The handle 20 also comprises a strut 44 to pivotally mount the switch trigger.

Figure 6:
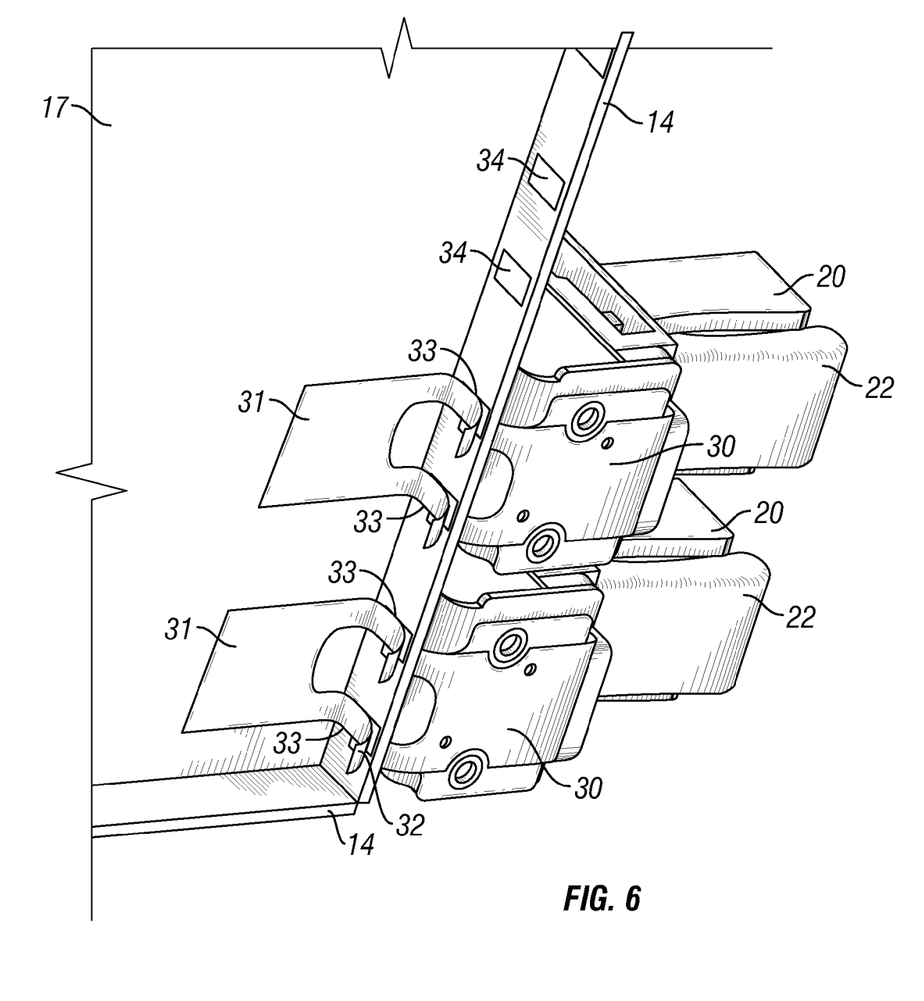
FIG. 6 is a rear view of the first flex circuit pathway.

FIG. 6 is a lower rear perspective view of the cassette flex circuitry 30 in contact with the chassis flex circuitry 31 to form the completed flex circuit. The contacts 32 of the cassette flex circuitry 30 align with openings 34 on the chassis 14. The chassis 14 comprises chassis flex circuitry 31 with contacts 33 that similarly align with the openings 34 so that contacts 33 make electrical contact with the contacts 32 of the cassette flex circuitry 30 to form a circuit.

Figure 7:
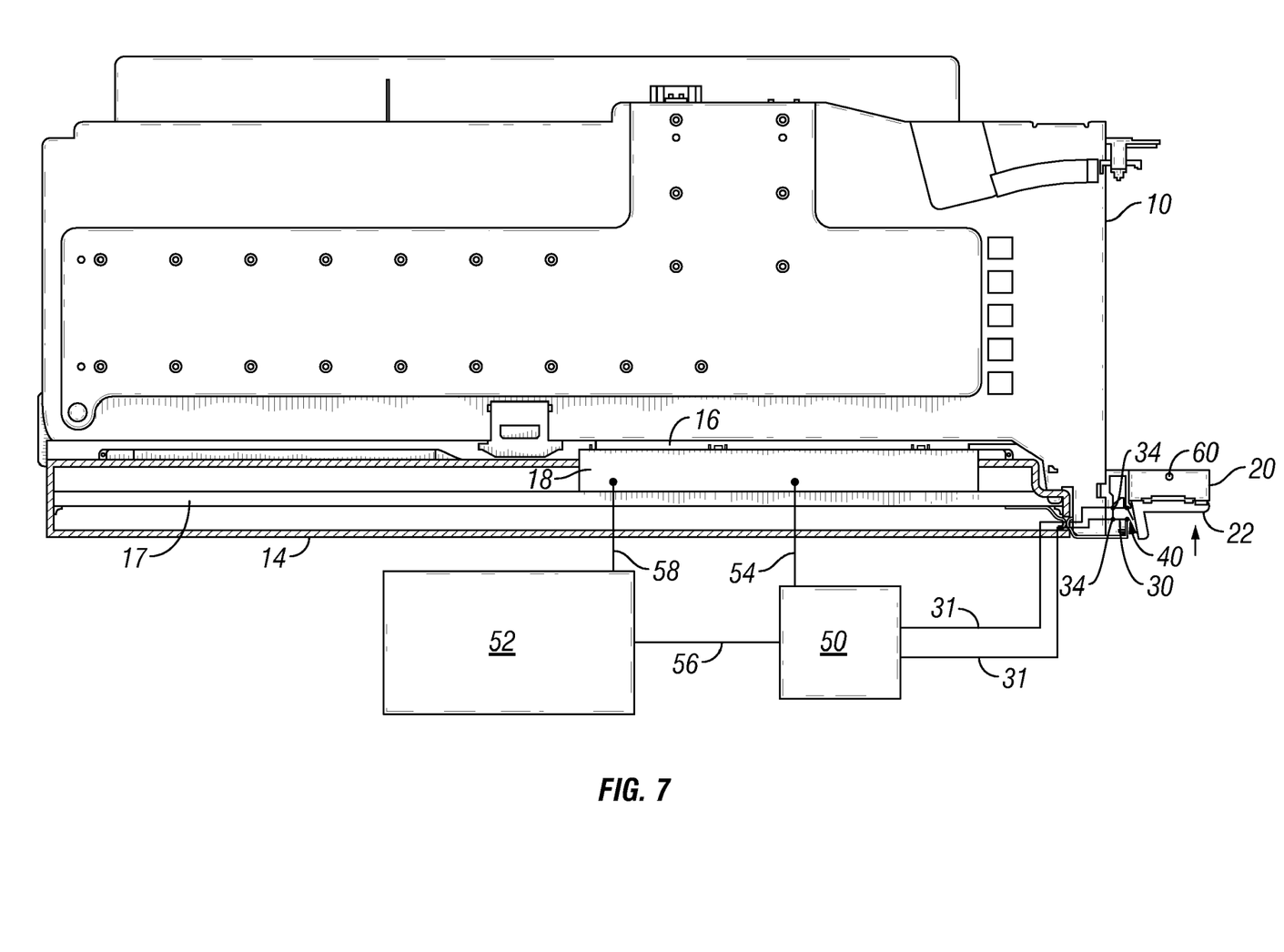
FIG. 7 is a schematic showing one potential operation of the present invention.

FIG. 7 is a schematic diagram of one potential embodiment of the present invention. The switch trigger 22 is shown in the depressed position (depressed upward), with the switch 40 open to interrupt or break the circuit that includes the cassette flex circuitry 30. The cassette flex circuitry 30 is in contact (at interface 34) with the chassis flex circuitry 31 via the contacts shown in FIG. 6. The chassis flex circuitry 31 is in electronic communication with a controller 50 having a first connection 56 to a power supply 52, and a second connection 54 to the first connector 18. The power supply 52 also has a third connection 58 to the first connector 18 for supplying electrical power.

When the cassette is fully received by the chassis and the user releases the switch trigger 22, the switch 40 is depressed in the closed position. This completes a circuit comprising the cassette flex circuitry 30, and the chassis flex circuitry 31. The completed flex circuit indicates to the controller 50 that the second electronic circuit board (not shown) in the cassette has been received by the first connector 18. In response to detecting the completed flex circuit, the controller 50 sends a signal to the power supply 52 to provide power to the first connector 18 through the third connection 58. The second electronic circuit board with a second connector in the cassette then receives power through the first connector 18. The controller may also send a signal to the first electronic circuit board or other components in order to initiate communications with the second electronic circuit board, such as the assignment of digital operations.

When the switch trigger 22 is again depressed or actuated by the user, the switch 40 is opened, breaking the circuit comprising the cassette flex circuitry 30 and the chassis flex circuitry 31. The controller 50 may then take several actions. The controller 50 may instruct the first electronic circuit board 17, via communication over the second connection 54 and through the first connector 18, that the second electronic circuit board (not shown) will be removed, and that no further operations are to be assigned to the second electronic circuit board. The controller 50 or the first electronic circuit board 17 may also instruct the second electronic circuit board to complete any operations that are currently underway. Upon receiving a signal through the first connector 18 that the second electronic circuit board is quiescent, the controller 50 may instruct the power supply 52 via a first connection 56 to remove power from the first connector 18 via the third connection 58. The user may be given an indication that the second electronic circuit board is quiescent through a signal sent from the controller 50 to a light emitting diode (LED) 60 on the handle 20. Since the cassette will lose power after becoming quiescent, it might be that the user indication will be the LED going out. Alternatively, the LED could be disposed on the chassis, since the chassis will presumably continue to have power. The user may then lift the handle 20 to disconnect the cassette from the chassis, thereby removing the second connector (not shown) from the first connector 18.

In this embodiment, completing the flex circuit comprising the cassette flex circuitry 30 and the chassis flex circuitry 31 by properly closing the cassette 10 and depressing the switch 40 indicates to the controller 50 that power may be supplied to the first connector 18 and processing operations may be assigned to components on the first electronic circuit board. When the flex circuit comprising the cassette flex circuitry 30 and the chassis flex circuitry 31 is broken, the controller 50 may undertake the operations described above to reach a quiescent state in the first electronic circuit board and halt power to the first connector 18.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus comprising: a chassis including a first electronic circuit board with a first connector, chassis flex circuitry with a disengageable contacts, a controller in communication with the chassis flex circuitry, and a power supply in communication with the controller and the first electronic circuit board; and a cassette selectively securable to the chassis, the cassette including a second electronic circuit board with a second connector, and a cassette handle with cassette flex circuitry that includes a switch and disengageable contacts, wherein securing the cassette to the chassis positions the disengageable contacts of the cassette flex circuitry in engagement with the disengageable contacts of the chassis flex circuitry to form a circuit and positions the first connector in electronic communication with the second connector, and wherein the circuit allows the controller to detect the condition of the switch; and a switch trigger on the cassette handle to actuate the switch; and wherein the switch trigger selectively locks or unlocks the cassette to the chassis.

2. The apparatus of claim 1, further comprising:
a spring to maintain the switch in a specified position.

3. The apparatus of claim 1, wherein the chassis further comprises an access cover that selectively completes the chassis flex circuitry.

4. The apparatus of claim 1, wherein the disengageable contact is comprised of a metal tab.

5. The apparatus of claim 1, further comprising:
a spring biasing the switch trigger to actuate the switch.

6. The apparatus of claim 1, wherein the chassis flex circuitry is disposed upon the first electronic circuit board.

7. The apparatus of claim 1, wherein the switch is a surface mount switch.

8. The apparatus of claim 1, further comprising an indicator light emitting diode (LED) controlled by the controller for indicating a quiescent state of the second electronic circuit board.

9. The apparatus of claim 4, wherein the metal tab includes gold contacts.

* * * * *